(12) United States Patent
Hanao et al.

(10) Patent No.: US 10,499,506 B2
(45) Date of Patent: Dec. 3, 2019

(54) COMPOSITE SUBSTRATE AND METHOD FOR MANUFACTURING COMPOSITE SUBSTRATE

(71) Applicant: Murata Manufacturing Co., Ltd., Nagaokakyo-shi, Kyoto-fu (JP)

(72) Inventors: Masaaki Hanao, Nagaokakyo (JP); Tsuyoshi Katsube, Nagaokakyo (JP); Hiromichi Kawakami, Nagaokakyo (JP); Mitsuyoshi Nishide, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/121,862

(22) Filed: Sep. 5, 2018

(65) Prior Publication Data
US 2018/0376594 A1    Dec. 27, 2018

Related U.S. Application Data

(63) Continuation of application No. PCT/JP2017/008059, filed on Mar. 1, 2017.

(30) Foreign Application Priority Data

Mar. 11, 2016   (JP) ................... 2016-048805

(51) Int. Cl.
*H05K 1/11*        (2006.01)
*H05K 3/46*        (2006.01)
(Continued)

(52) U.S. Cl.
CPC .............. *H05K 1/115* (2013.01); *B32B 27/06* (2013.01); *H05K 3/46* (2013.01); *H05K 1/0306* (2013.01); *H05K 1/162* (2013.01)

(58) Field of Classification Search
CPC ........ H05K 1/0306; H05K 1/115; H05K 1/03; H05K 1/036; H05K 1/162; H05K 2201/01;
(Continued)

(56) References Cited

U.S. PATENT DOCUMENTS 4,931,354 A    6/1990   Wakino et al.
5,144,536 A *  9/1992   Tsukada .............. H01L 21/4807
                                                 174/258
(Continued)

FOREIGN PATENT DOCUMENTS

JP    S61229549 A    10/1986
JP    H0634435 A      2/1994
(Continued)

OTHER PUBLICATIONS

International Search Report issued in PCT/JP2017/008059, dated May 30, 2017.
(Continued)

*Primary Examiner* — Roshn K Varghese
(74) *Attorney, Agent, or Firm* — Arent Fox LLP

(57) ABSTRACT

A composite substrate that is composed of a resin layer including an interlayer connection metal conductor and multiple ceramic layers that each include interlayer connection metal conductor, such that the resin layer is interposed between the ceramic layers, and the interlayer connection metal conductor in the resin layer is integrated with the interlayer connection metal conductors in the ceramic layers.

19 Claims, 7 Drawing Sheets

(51) Int. Cl.
*H05K 1/03* (2006.01)
*B32B 27/06* (2006.01)
*H05K 1/16* (2006.01)

(58) Field of Classification Search
CPC ... H05K 2201/0137; H05K 2201/0183; H05K 3/4629; H05K 3/46; H05K 2201/096; H05K 2201/09818; B32B 27/06
See application file for complete search history.

(56) References Cited

U.S. PATENT DOCUMENTS

| | | | | |
|---|---|---|---|---|
| 5,562,973 | A * | 10/1996 | Nagasaka | H01L 21/4867 428/209 |
| 5,977,490 | A * | 11/1999 | Kawakita | H01B 1/22 174/255 |
| 6,183,669 | B1 * | 2/2001 | Kubota | B32B 18/00 106/1.25 |
| 7,161,241 | B2 * | 1/2007 | Kimura | H01L 23/5385 257/724 |
| 8,164,920 | B2 | 4/2012 | Kariya | |
| 2001/0023779 | A1 * | 9/2001 | Sugaya | H05K 1/16 174/255 |
| 2002/0030297 | A1 * | 3/2002 | Gallagher | B29C 67/202 264/49 |
| 2003/0168727 | A1 * | 9/2003 | Kimura | H01L 23/5385 257/700 |
| 2003/0219588 | A1 * | 11/2003 | Ogawa | H01L 23/49894 428/308.4 |
| 2004/0099364 | A1 * | 5/2004 | Suzuki | B32B 18/00 156/89.11 |
| 2004/0101626 | A1 * | 5/2004 | Kanada | C08J 9/26 427/385.5 |
| 2006/0257631 | A1 * | 11/2006 | Chang | H05K 1/112 428/195.1 |
| 2009/0272566 | A1 * | 11/2009 | Nomiya | H01B 1/16 174/257 |
| 2009/0290316 | A1 | 11/2009 | Kariya | |
| 2010/0116530 | A1 * | 5/2010 | Okazaki | H05K 3/4688 174/257 |
| 2011/0024167 | A1 * | 2/2011 | Hashimoto | H05K 3/4688 174/258 |

FOREIGN PATENT DOCUMENTS

| | | |
|---|---|---|
| JP | H0653652 A | 2/1994 |
| JP | H07142867 A | 6/1995 |
| JP | 2605306 B2 | 4/1997 |
| JP | 2001143965 A | 5/2001 |
| JP | 2002185093 A | 6/2002 |
| JP | 2003304064 A | 10/2003 |
| JP | 2007317711 A | 12/2007 |
| JP | 2007335584 A | 12/2007 |
| JP | 2007335585 A | 12/2007 |
| JP | 2009182285 A | 8/2009 |
| JP | 2012216684 A | 11/2012 |
| WO | 2006134914 A1 | 12/2006 |

OTHER PUBLICATIONS

Written Opinion of the International Searching Authority issued in PCT/JP2017/008059, dated May 30, 2017.

* cited by examiner

COMPOSITE SUBSTRATE AND METHOD FOR MANUFACTURING COMPOSITE SUBSTRATE

CROSS REFERENCE TO RELATED APPLICATIONS

The present application is a continuation of PCT/JP2017/008059 filed Mar. 1, 2017, which claims priority to Japanese Patent Application No. 2016-048805, filed Mar. 11, 2016, the entire contents of each of which are incorporated herein by reference.

TECHNICAL FIELD

The present disclosure relates to a composite substrate and a method for manufacturing a composite substrate.

BACKGROUND

In general, in the mobile communication industry with regard to mobile phones, for example, a reduction in size and profile and a low transmission loss of a mobile communication module substrate have been required in accordance with a frequency increase in a communication frequency band. Patent Document 1 (identified below) proposes formation of an air layer, which is a low dielectric material, as a device that realizes a low transmission loss in a ceramic multilayer substrate.

Patent Document 1: Japanese Unexamined Patent Application Publication No. 2003-304064.

As disclosed in Patent Document 1, a ceramic multilayer substrate including an air layer exhibits low strength against impact and, therefore, has a problem in terms of practical reliability. In addition, in the method for manufacturing a substrate having the above-described configuration, an unsintered ceramic layer is removed after firing the substrate such that the resulting portion is made to be an air layer. However, a reaction layer having some thickness is present at the interface between the unsintered ceramic layer and a dense sintered ceramic layer, and it is difficult to remove the reaction layer. Therefore, the substrate has to include the air layer having a thickness of as much as 300 μm or more. Consequently, such an existing design does not sufficiently address a requirement to reduce size and profile for a mobile phone.

SUMMARY OF THE INVENTION

The present disclosure was realized so as to address the above-described problems, and it is an object to provide a substrate that has high strength against impact and that can be designed so as to address the requirement to reduce size and profile.

In order to address the above-described objective, a composite substrate according to an exemplary embodiment of the present disclosure is composed of a resin layer including an interlayer connection metal conductor and ceramic layers including interlayer connection metal conductors, wherein the resin layer is interposed between the ceramic layers, and the interlayer connection metal conductor in the resin layer is integrated with the interlayer connection metal conductors in the ceramic layers.

In the composite substrate according to the exemplary embodiment, the resin layer is interposed between the ceramic layers. The resin layer serves as a stress relaxation layer and, therefore, when the resin layer is disposed, a composite substrate can have higher strength against impact than the case in which an air layer interposed between the ceramic layers is located.

In the composite substrate according to the exemplary embodiment, the interlayer connection metal conductor in the resin layer is integrated with the interlayer connection metal conductors in the ceramic layers. This integration signifies that an intermetallic bonding state between the metal conductor in the ceramic layer and the metal conductor in the resin layer is the same as the intermetallic bonding state between the metal conductors in a plurality of ceramic layers. When the metal conductors are integrated with each other, as described above, the bonding strength between the metal conductors is ensured, and the composite substrate can have high connection reliability.

In addition, by using a functional resin layer that is a resin layer in which a resin material having functionality is used, the composite substrate can be provided with characteristics that are difficult for a ceramic material to realize. For example, a transmission loss in a high-frequency region can be reduced by using a resin material having low permittivity (for example, relative permittivity $\varepsilon_r$ of 2 or less) that is difficult for a ceramic material to realize.

In the composite substrate according to an aspect of the exemplary embodiment, the proportion of a metal material contained in the interlayer connection metal conductor in the resin layer is preferably 40% by weight or more and 99% by weight or less. When the proportion of the metal material is set to be 40% by weight or more, good electrical characteristic are readily exerted. In addition, when the proportion of the metal material is 99% by weight or less, that is, when there is a material (ceramic material or the like) other than the metal material is present, a strong bonding state with the interlayer connection metal conductor in the ceramic layer can be formed and the composite substrate can have higher strength against impact.

In the composite substrate according to an aspect of the exemplary embodiment, the difference between the proportion (% by weight) of the metal material contained in the interlayer connection metal conductor in the resin layer and the proportion (% by weight) of a metal material contained in each interlayer connection metal conductor in the ceramic layers is preferably 59% by weight or less. When the above-described difference in the proportion of the metal material is 59% by weight or less, the interlayer connection metal conductors in the resin layer and the ceramic layers have similar characteristics, and the same applies to sintering behavior, thermal expansion characteristic, and strength. Consequently, bonding between metal conductors can be enhanced. As a result, the composite substrate can have higher strength against impact.

In the composite substrate according to an aspect of the exemplary embodiment, the tensile modulus of elasticity of the resin layer is preferably 3 GPa or less. When the tensile modulus of elasticity of the resin layer is set to be 3 GPa or less, the resin layer more effectively functions as a stress relaxation layer with respect to impact. Consequently, the substrate can have higher strength to drop impact and thermal shock than a ceramic substrate composed of only ceramic layers and a substrate including an air layer. The tensile modulus of elasticity of the resin material can be calculated by using a test piece of 25 mm wide×150 mm long on the basis of JIS K 7161.

In the composite substrate according to an aspect of the exemplary embodiment, the relative permittivity $\varepsilon_r$ of the resin layer is preferably 1.5 or more and 3 or less. The measurement of the permittivity can be performed by a perturbation method, where a sample having a size of 50 mm×50 mm×t of 0.5 mm is subjected to the measurement at a frequency of 9 GHz. When the relative permittivity $\varepsilon_r$ is 1.5 or more and 3 or less, the substrate is suitable for reducing a transmission loss in a high-frequency region. It is difficult for a substrate composed of only ceramic layers to realize such low permittivity.

In the composite substrate according to an aspect of the exemplary embodiment, the thickness of the resin layer is preferably 5 μm or more and 100 μm or less. When the thickness of the resin layer is set to be 100 μm or less, the substrate can sufficiently address the requirement to reduce size and profile.

In the composite substrate according to an aspect of the exemplary embodiment, preferably, the resin layer includes a multilayer lead. When a plurality of hollow-forming sheets are used in a method for manufacturing the composite substrate according to the present invention, as described later, the resin layer can include a multilayer lead.

In the composite substrate according to an aspect of the exemplary embodiment, preferably, voids are located in the resin layer. When the resin layer is formed by infiltrating and curing a liquid containing a resin material in a method for manufacturing the composite substrate according to the present invention, as described later, voids are located in the resin layer. In this regard, when voids are located, void portions serve as portions having low permittivity. Consequently, the permittivity of the entire resin layer is reduced, and the resin layer has a configuration suitable for reducing a transmission loss in a high-frequency region.

In the composite substrate according to an aspect of the exemplary embodiment, preferably, the resin layer contains a gap-forming material. When the resin layer contains a gap-forming material, a difference in the thermal expansion coefficient between the resin layer and the ceramic layer can be decreased and heat cycle characteristics can be improved. In addition, when the resin layer contains a gap-forming material, the permittivity of the resin layer can be reduced and, therefore, the resin layer suitable for reducing a transmission loss in a high-frequency region is formed.

In the composite substrate according to an aspect of the exemplary embodiment, preferably, the ceramic layers include a first ceramic layer and a second ceramic layer, the resin layer is disposed between the first ceramic layer and the second ceramic layer, and the composition of a ceramic material forming the first ceramic layer is different from the composition of a ceramic material forming the second ceramic layer. When such a configuration is adopted, ceramic layers composed of different materials can be included in the composite substrate. In addition, ceramic layers composed of different materials can be co-sintered without an occurrence of structural defect or mutual diffusion.

In an exemplary aspect, part of an aspect of the resin layer is preferably exposed at the side surface of the composite substrate. In a method for manufacturing a composite substrate according to the present invention, as described later, the resin layer can be formed by injecting a resin material or a liquid containing a resin material into a hollow between the ceramic layers through the surface that is to be the side surface of the composite substrate. Exposure of part of the resin layer at the side surface of the composite substrate signifies that the side surface of the composite substrate functions as an injection port of the resin material.

In the composite substrate according to an aspect of the exemplary embodiment, preferably, each of the ceramic layer and the resin layer includes a functional portion or component, with the respective functional portions of the ceramic layer and the resin layer have portions arranged at the same height. When portions arranged at the same height are present in the functional portion of the ceramic layer and the functional portion of the resin layer, the size and the profile of the composite substrate can be reduced compared with the case in which no portions arranged at the same height are present in the functional portion of the ceramic layer and the functional portion of the resin layer.

In this regard, preferably, the functional portion/component of the ceramic layer is a capacitor, and the functional portion/component of the resin layer is an inductor or a transmission line. The capacitance of the capacitor can be increased by forming a capacitor in the ceramic layer having high relative permittivity, and the high-frequency characteristics can be made favorable by arranging an inductor or a transmission line in the resin layer having low relative permittivity. Meanwhile, the functional portion/component of the resin layer may be a helical inductor. Moreover, in an exemplary aspect of the composite substrate, the thickness of the composite substrate can be decreased even when a helical inductor is disposed.

A method for manufacturing a composite substrate according to an exemplary embodiment includes the steps of preparing a multilayer body in which ceramic green sheets that are composed of an unsintered ceramic material and that have an interlayer connection metal conductor paste and a hollow-forming sheet that is composed of a hollow-forming material and that has an interlayer connection metal conductor paste are stacked such that the hollow-forming sheet is interposed between the ceramic green sheets in a multilayer body preparation step, firing the multilayer body at a firing temperature equal to or higher than the sintering starting temperatures of the metal conductor paste in the ceramic green sheets and the metal conductor paste in the hollow-forming sheet so as to form interlayer connection metal conductors by integrally sintering the metal conductor paste in the ceramic green sheets and the metal conductor paste in the hollow-forming sheet, to form the ceramic layers by sintering the unsintered ceramic material, and to form a hollow between the ceramic layers by burning off the hollow-forming material in a firing step, and forming a resin layer between the ceramic layers by dipping a substrate having the hollow into a liquid containing a resin material so as to fill the hollow with the resin material and by performing curing in a resin-layer-forming step.

According to the above-described steps, the unfired ceramic material forming the ceramic green sheets, the metal conductor paste in the ceramic green sheets, and the metal conductor paste in the hollow-forming sheet can be co-sintered in the firing step. The metal conductor pastes are sintered so as to form interlayer connection metal conductors.

Meanwhile, regarding the hollow-forming sheet, the hollow-forming material that has been present as a portion other than a portion to be made into a metal conductor in the firing step is burnt off and a hollow results. The metal conductor paste in the ceramic green sheets and the metal conductor paste in the hollow-forming sheet are integrally co-sintered and, as a result, the interlayer connection metal conductors in the ceramic layers and the interlayer connection metal conductor in the resin layer are integrated so as to ensure the bonding strength between the metal conductors. Consequently, the composite substrate having high connection reliability can be produced.

In addition, according to the above-described steps, a resin layer can be formed between the ceramic layers by filling the hollow with the resin material and curing the resin material. The heat-resistant temperature of the resin material is lower than the sintering temperature of the unsintered ceramics forming the ceramic green sheet and the sintering temperature of the metal conductor paste. Therefore, if the resin layer is disposed before firing of the ceramic green sheets, the resin material is burnt off during the firing step. However, after firing of the ceramic green sheets, the resin layer can be disposed by the above-described method.

When the step of forming the resin layer and the step of forming the interlayer connection metal conductor disposed in the resin layer are separated from each other, the composite substrate in which the interlayer connection metal conductor in the resin layer and the interlayer connection metal conductors in the ceramic layers are integrated and firmly bonded and which includes a resin layer can be produced.

In the method for manufacturing a composite substrate according to the exemplary embodiment, preferably, the hollow-forming sheet is a carbon sheet, and the hollow-forming material is carbon.

When the carbon sheet is used, the thickness of the hollow can be readily decreased by using the carbon sheet having a small thickness. In this regard, the carbon serving as the hollow-forming material can be burnt off during the firing step and, therefore, is suitable for forming the hollow.

In the method for manufacturing a composite substrate according to the exemplary embodiment, preferably, the hollow-forming material is a material having a weight decreasing rate of 10% or less when firing for 1 hour at a sintering starting temperature of the metal conductor paste in the hollow-forming sheet and having a weight decreasing rate of 99% or more when firing for 1 hour at a firing temperature during the firing step. The weight decreasing rate can be measured by a TG-DTA apparatus, where the metal conductor paste is maintained at the sintering starting temperature or the firing temperature for a predetermined time.

The weight decreasing rate of the hollow-forming material having the above-described characteristics is small at the sintering starting temperature of the metal conductor paste. This signifies that the hollow-forming material is a material not readily burnt off at the sintering starting temperature at which sintering of the metal conductor paste starts. Consequently, sintering of the metal conductor paste occurs prior to burning off of the hollow-forming material during the firing step, and a firm metal conductor is formed first.

Meanwhile, the weight decreasing rate of the hollow-forming material having the above-described characteristics is large at the firing temperature. This signifies that the hollow-forming material is a material readily being burnt off at the firing temperature. Consequently, the hollow-forming material is burnt off after a firm metal conductor is formed and, therefore, a hollow can be formed. At the point in time when the hollow-forming material is burnt off, a firm metal conductor has been formed in advance. Therefore, the shape of the metal conductor is not deformed, the hollow is held by the metal conductor so as to form a hollow having a uniform thickness.

In the method for manufacturing a composite substrate according to the exemplary embodiment, the firing temperature during the firing step is preferably 800° C. or higher and 1,000° C. or lower. The above-described firing temperature is preferable because of being suitable for performing sintering of the metal conductor pastes in the ceramic green sheet and the hollow-forming sheet, sintering of the unsintered ceramic material, and burning off of the hollow-forming material in the same firing step.

According to the exemplary embodiments of the present disclosure described herein, a substrate is provided that has high strength against impact and that can be designed so as to address industry requirements to reduce size and profile.

DETAILED DESCRIPTION OF EXEMPLARY EMBODIMENTS

A composite substrate according to an exemplary embodiment and a method for manufacturing the same will be described below. However, it should be appreciated that the exemplary embodiments of the present disclosure are not limited to the following configuration, and the configuration can be appropriately modified and applied within the bounds of not departing from the gist of the present invention. It is needless to say that each of the embodiments described below is an exemplification and that configurations shown in different embodiments can be partly replaced or combined with each other.

First Embodiment

<Composite Substrate>

Figure 1:
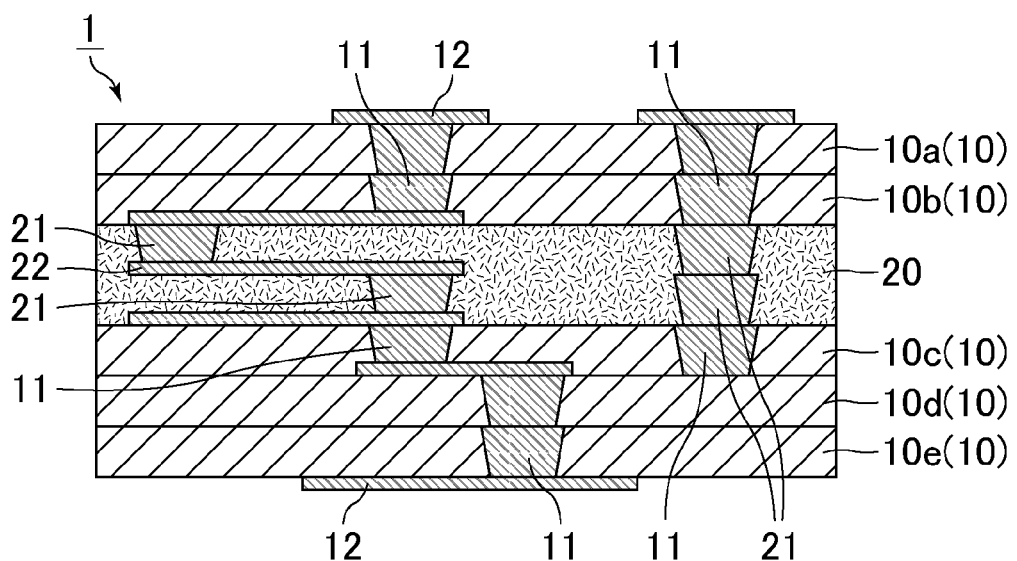
FIG. 1 is a schematic sectional view showing an example of a composite substrate according to an exemplary embodiment.

First, an example of the configuration of the composite substrate will be described. FIG. 1 is a schematic sectional view showing an example of a composite substrate according to an exemplary embodiment. As shown, the composite substrate 1 is composed of a resin layer 20 and ceramic layers 10 (10a, 10b, 10c, 10d, and 10e). Moreover, the resin layer 20 is interposed between the ceramic layer 10b and the ceramic layer 10c.

In the resin layer 20, a resin material serving as an insulating material is present and interlayer connection metal conductors 21 are included. In the ceramic layers 10, a ceramic material serving as an insulating material is present and interlayer connection metal conductors 11 are included. In this regard, the metal conductors 11 in the ceramic layers 10 and the metal conductors 21 in the resin layer 20 are integrated.

The right portion of FIG. 1 shows an example in which the metal conductors 11 and the metal conductors 21 are arranged in a straight line in the thickness direction so as to form an integrated columnar metal conductor.

The left portion of FIG. 1 shows metal leads 12 disposed in the direction in which the ceramic layers 10 extends and metal leads 22 disposed in the direction in which the resin layer 20 extends and shows an example in which the metal conductors 11 and the metal conductors 21 are integrated with the metal leads 12 or the metal leads 22 interposed therebetween. In the present specification, a concept of the interlayer connection metal conductor in the ceramic layer and the interlayer connection metal conductor in the resin layer being integrated is not limited to the case where metal conductors are made to be a columnar metal conductor in which the metal conductors are arranged in a straight line in the thickness direction and are integrated, as shown in the right portion of FIG. 1. Instead, the configuration can also include the case in which interlayer connection metal conductors are integrated and connected with the metal lead that is disposed in the direction in which the layer extends and that is interposed between the metal conductors, as shown in the left portion of FIG. 1.

The ceramic material forming the ceramic layer 10 is a sintered ceramic material. Preferably, the ceramic material contains a low-temperature-sintering ceramic material. The low-temperature-sintering ceramic material refers to, among the ceramic materials, a material that can be sintered at a firing temperature of 1,000° C. or lower and that can be co-fired with silver or copper favorably used as a metal material.

Specific examples used as the low-temperature-sintered ceramic material may include a glass-composite-based low-temperature-sintering ceramic material in which borosilicate glass is mixed into a ceramic material, for example, quartz, alumina, or forsterite, and a crystallized-glass-based low-temperature-sintering ceramic material in which ZnO—MgO—$Al_2O_3$—$SiO_2$-based glass is used, a non-glass-based low-temperature-sintering ceramic material in which a BaO—$Al_2O_3$—$SiO_2$-based ceramic material, an $Al_2O_3$—CaO—$SiO_2$—MgO—$B_2O_3$-based ceramic material, or the like is used.

FIG. 1 shows an aspect in which a plurality of ceramic layers 10 are disposed on and under the resin layer 20. However, at least one ceramic layer may be disposed on and under the resin layer such that the resin layer is interposed between the ceramic layers.

According to an exemplary aspect, the resin material that forms the resin layer 20 can be any resin material having characteristics and functions that are required to be provided to the composite substrate may be used. For example, fluororesins, silicone rubbers, hydrocarbon-based resins having small amounts of polar groups (for example, polyethylenes, polypropylenes, and polystyrenes) may be used favorably. More preferable examples include fluororesins having a permittivity $\varepsilon_r$ of about 2.6, silicone rubbers having a permittivity $\varepsilon_r$ of about 3.0, polyethylenes having a permittivity $\varepsilon_r$ of about 2.25, polypropylenes having a permittivity $\varepsilon_r$ of about 2.2, and polystyrenes having a permittivity $\varepsilon_r$ of about 2.45. These resin materials have low permittivity and, therefore, are suitable for a resin material forming a resin layer for reducing a transmission loss in a high-frequency region. Meanwhile, it is preferable that voids be located in the resin layer, and it is also preferable that a gap-forming material, e.g., hollow beads, be included in the resin layer. It is also preferable that voids and, in addition, a gap-forming material be included in the resin layer. When voids or a gap-forming material is included in the resin layer, the permittivity of the resin layer can be reduced and, therefore, a resin layer suitable for reducing a transmission loss in a high-frequency region is formed. In this regard, the relative permittivity $\varepsilon_r$ of the resin layer is preferably 1.5 or more and 3 or less. The relative permittivity of the resin layer is not determined in accordance with the relative permittivity of the resin material but with the measured value of the relative permittivity of the entire resin layer. Therefore, when voids, a gap-forming material, and other insulating materials, e.g., a filler, are included in the resin layer, their contributions are also involved.

Meanwhile, when the resin layer contains the gap-forming material, a difference in the thermal expansion coefficient between the resin layer and the ceramic layer can be decreased, and the heat cycle characteristics can be improved.

Hollow beads may be used as the gap-forming material. Examples of hollow beads include beads, each of which has a shell layer containing at least one inorganic material selected from a group consisting of $SiO_2$, $Al_2O_3$, $ZrO_2$, $TiO_2$, and MgO as a primary component, and the shell layer has a hollow. In particular, preferably, a shell layer containing $SiO_2$ as a primary component is included. In this regard, a closed type hollow bead in which the hollow portion is entirely covered with the shell layer is preferable. The proportion of the gap-forming material in the resin layer is preferably 20% by volume or more and more preferably 40% by volume or more.

Regarding the resin material having a low tensile modulus of elasticity, fluororesins, polyimide resins, polyether ketone resins, polyphenylene sulfide resins, cycloolefin resins, and the like may be used favorably. More preferable specific examples may include fluororesins having a tensile modulus of elasticity E (GPa) of about 0.39 or more and 0.55 or less and cycloolefin resins having a tensile modulus of elasticity E (GPa) of about 2.1 or more and 2.2 or less. These resin materials have a low tensile modulus of elasticity and, therefore, are suitable for the resin material that forms the resin layer serving as a stress relaxation layer with respect to impact. In this regard, the tensile modulus of elasticity of the resin layer is preferably 3 GPa or less. The tensile modulus of elasticity of the resin layer is more preferably 1 GPa or less. Meanwhile, the tensile modulus of elasticity of the resin layer is preferably 0.02 GPa or more. In addition, materials, e.g., rubber-based materials and thermoplastic elastomers (vinyl-chloride-based, styrene-based, olefinbased, ester-based, urethane-based, amide-based, and the like) may be used. The tensile modulus of elasticity of the resin layer is not determined in accordance with the tensile modulus of elasticity of the resin material but with the measured value of the tensile modulus of elasticity of the entire resin layer.

The thickness of the resin layer is preferably 5 μm or more and 100 μm or less and more preferably 5 μm or more and 50 μm or less.

The metal conductors 21 in the resin layer 20 and the metal conductors 11 in the ceramic layers 10 are integrated. Preferably, the material for forming each of the metal conductor 21 and the metal conductor 11 is a mixture of a metal material and a ceramic material. The metal material preferably contains at least one selected from a group consisting of gold, silver, and copper and more preferably contains silver or copper. Gold, silver, and copper have low resistance and, therefore, are particularly suitable for cases in which the composite substrate is used at high frequency. Regarding the ceramic material, the same material as the ceramic material for forming the ceramic layer may be used favorably. Use of the same ceramic material can equilibrate the sintering behavior of the ceramic material forming the ceramic layer and the sintering behavior of the metal conductor paste.

The proportion of the metal material contained in the interlayer connection metal conductor in the resin layer is preferably 40% by weight or more and 99% by weight or less, more preferably 60% by weight or more, and more preferably 90% by weight or less. The proportion of the metal material contained in the metal conductor of 99% by weight or less signifies that the metal conductor in the resin layer is different from a metal conductor having a composition composed of only a metal formed by a plating method or the like that is a method for forming a metal conductor commonly used for a resin substrate. As described later, the metal conductor can be formed by firing the metal conductor paste, but the metal conductor produced through firing the metal conductor paste contains materials, e.g., a ceramic material, other than the metal material. Therefore, the composition is not composed of only the metal material. The metal conductor produced through firing the metal conductor paste can form a firm bond and enhance connection reliability compared with a metal conductor that is formed by plating or the like, that is composed of only the metal material, and that is not subjected to firing. Also, in this regard, the proportion of the metal material contained in the interlayer connection metal conductor in the ceramic layer is preferably 40% by weight or more and 99% by weight or less, more preferably 60% by weight or more, and more preferably 90% by weight or less. It is preferable that the proportion of the metal material contained in the interlayer connection metal conductor be preferably set to be 40% by weight or more because the resistance value of the composite substrate does not become excessively large.

Preferably, the interlayer connection metal conductor in the resin layer and the interlayer connection metal conductor in the ceramic layer have the same composition. When the metal conductor pastes having the same composition are used and metal conductors are formed by co-firing, the interlayer connection metal conductor in the resin layer and the interlayer connection metal conductor in the ceramic layer have the same composition. Also, even when the interlayer connection metal conductors in the resin layer and the ceramic layer do not have the same composition but have nearly the same compositions, similar characteristics are exhibited favorably. Specifically, the difference between the proportion (% by weight) of the metal material contained in the interlayer connection metal conductor in the resin layer and the proportion (% by weight) of the metal material contained in the interlayer connection metal conductor in the ceramic layer is preferably 59% by weight or less. More preferably the difference is 30% by weight or less because the characteristics of the metal conductors at the interface are readily made equal. In this regard, the lower limit value of the above-described difference is desirably 0% by weight (the compositions of the two metal conductors are equal), but the lower limit value may be 0.001% by weight (the above-described difference is 0.001% by weight or more).

The resin layer may include a multilayer lead. The resin layer serving as the insulating layer forming the resin layer is a single layer because of being formed by a single resin infiltration, as described later. However, the interlayer connection metal conductors may be stacked in layers, and the metal leads formed in the direction in which the layer extends may be multilayer. The composite substrate 1 shown in FIG. 1 is an example in which the resin layer 20 includes a multilayer lead composed of two layers.

FIG. 1 shows the configuration of "ceramic layer—resin layer—ceramic layer" in which only one layer of the resin layer is disposed. However, a plurality of the resin layers may be disposed as long as the resin layers are interposed between the ceramic layers. For example, a composite substrate having a layer configuration such as "ceramic layer—resin layer—ceramic layer—resin layer—ceramic layer" is included in the composite substrate according to the present invention.

<Method for Manufacturing Composite Substrate>

Figure 2:
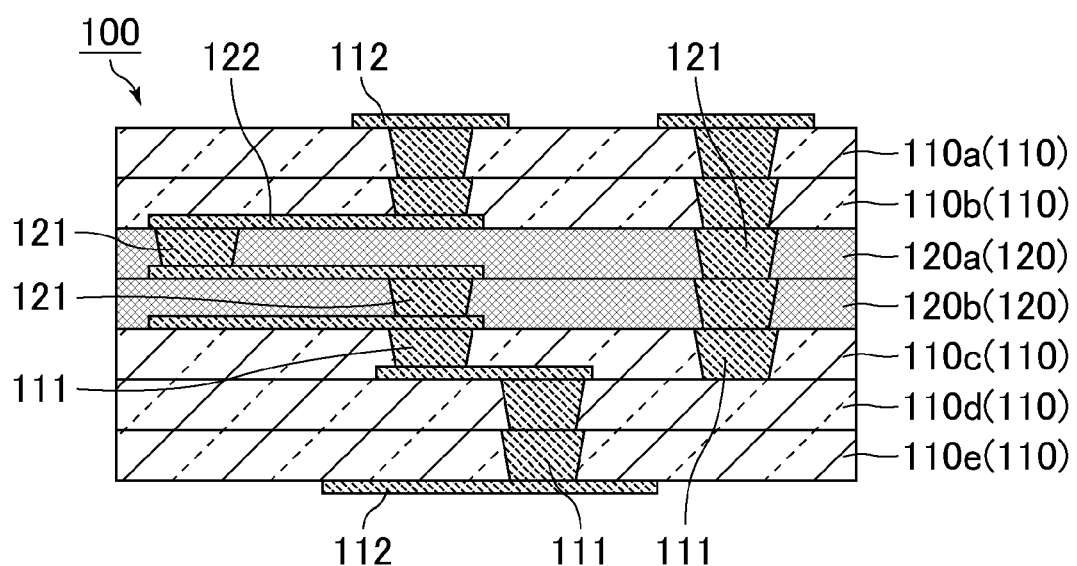
FIG. 2 is a schematic sectional view showing some steps of a method for manufacturing a composite substrate according to an exemplary embodiment.
Figure 3:
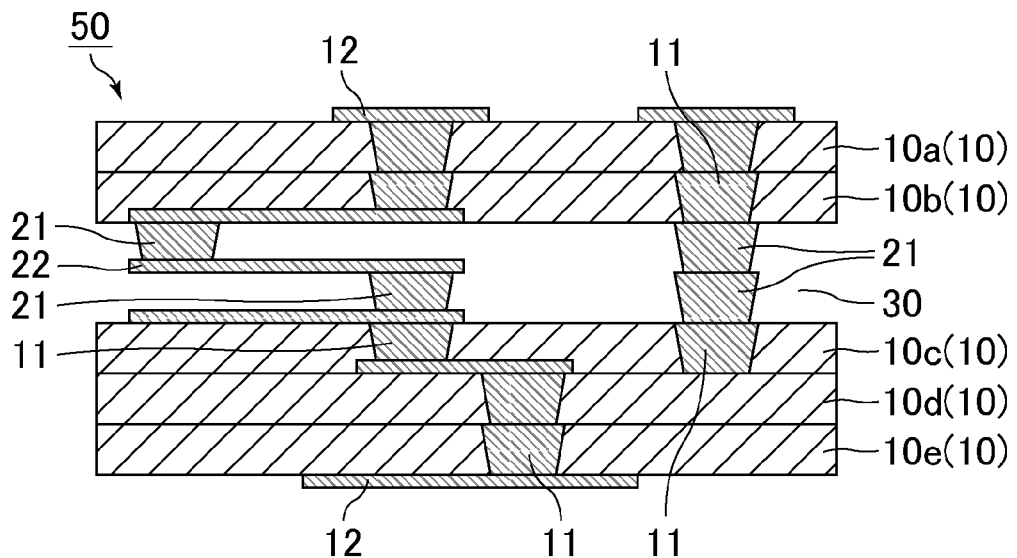
FIG. 3 is a schematic sectional view showing some steps of the method for manufacturing a composite substrate according to an exemplary embodiment.

Next, an example of a method for manufacturing a composite substrate will be described. FIG. 2 and FIG. 3 are schematic sectional views showing some steps of a method for manufacturing a composite substrate according to the present invention. First, a multilayer body preparation step of preparing a multilayer body in which stacking is performed such that a hollow-forming sheet is interposed between ceramic green sheets is performed.

Initially, each ceramic green sheet is prepared. A ceramic green sheet is produced by forming a ceramic slurry serving as an unsintered ceramic material into the shape of a sheet by a doctor blade method or the like. The ceramic slurry contains a powder serving as a raw material for a glass ceramic in which alumina and borosilicate glass are mixed or a powder serving as a raw material for a Ba—Al—Si—O-based ceramic that generates a glass component during firing, an organic binder, and a solvent. The ceramic slurry may contain various additives, e.g., a dispersing agent and a plasticizer.

Regarding the organic binder, for example, a butyral resin (polyvinyl butyral), an acrylic resin, and a methacrylic resin may be used. Regarding the solvent, for example, toluene and alcohol, e.g., isopropylene alcohol, may be used. Regarding the plasticizer, for example, di-n-butyl phthalate may be used.

Holes are bored in the ceramic green sheets by using a laser or a mechanical punch, and the holes are filled with an interlayer connection metal conductor paste. In addition, a metal conductor paste is used, and leads and electrodes are formed on the ceramic green sheets by a screen printing method or the like. A paste containing the above-described metal material and a ceramic material forming the ceramic layer is suitable for use as the metal conductor paste. Preferably, the metal conductor paste contains a solvent, an organic binder, and the like. Also, the metal conductor paste preferably contains a metal material such that the proportion of the metal material contained in the metal conductor after firing is 40% by weight or more and 99% by weight or less. Each ceramic green sheet that is composed of the unfired ceramic material and that has the interlayer connection metal conductor paste is prepared in the above-described procedure.

A hollow-forming sheet is prepared separately. The hollow-forming sheet is a sheet that is composed of a hollow-forming material and that has the interlayer connection metal conductor paste, the hollow-forming material being burnt off during a downstream firing step so as to form a hollow at the location at which the hollow-forming material has been present. Preferably, the hollow-forming material is a material having a weight decreasing rate of 10% or less when firing for 1 hour at a sintering starting temperature of the metal conductor paste in the hollow-forming sheet and having a weight decreasing rate of 99% or more when firing for 1 hour at a firing temperature during the firing step. In this regard, the hollow-forming material is preferably a material that is burnt off at the firing temperature (preferably 800° C. or higher and 1,000° C. or lower) or lower. Specifically, the hollow-forming material is preferably a material that is burnt off at a temperature of 850° C. or higher and 950° C. or lower. The hollow-forming material is preferably carbon, and a carbon sheet may be preferably used as the hollow-forming sheet.

The carbon sheet may be produced by adding an organic binder, a dispersing agent, and a plasticizer to carbon, performing mixing and grinding so as to produce a slurry, forming the resulting slurry into the shape of a sheet on a substrate film by a doctor blade method, and performing drying. The thickness of the hollow-forming sheet may be appropriately set in accordance with the thickness of a hollow to be formed after a firing step, and is preferably 5 µm or more and 100 µm or less. The thickness is set to be more preferably 5 µm or more and 50 µm or less. Meanwhile, a commercially available carbon sheet (graphite sheet) may also be used.

In the same manner as the ceramic green sheet, holes are bored in the hollow-forming sheet by a laser or a mechanical punch, and the holes are filled with an interlayer connection metal conductor paste. In addition, a metal conductor paste is used, and leads and electrodes are formed on the hollow-forming sheet by a screen printing method or the like. Preferably, the same metal conductor paste as the metal conductor paste used for producing the ceramic green sheet is used. Also, the metal conductor paste preferably contains a metal material such that the proportion of the metal material contained in the metal conductor after firing is 40% by weight or more and 99% by weight or less. When a metal conductor paste different from the metal conductor paste used for producing the ceramic green sheet is used, preferably, the metal conductor paste to be used satisfies that the difference between the proportion (% by weight) of the metal material contained in the metal conductor paste used for producing the ceramic green sheet and the proportion (% by weight) of the metal material contained in the metal conductor paste used for producing the hollow-forming sheet is 59% by weight or less.

Meanwhile, the hollow-forming sheet after being bored may be filled with the ceramic paste having the same composition as the composition of the ceramic paste used for producing the ceramic green sheet. The hollow-forming sheet that is composed of the hollow-forming material and that has the interlayer connection metal conductor paste is prepared in the above-described procedure.

Subsequently, the ceramic green sheets and the hollow-forming sheet are stacked such that the hollow-forming sheet is interposed between the ceramic green sheets. FIG. 2 schematically shows a multilayer body, in which the hollow-forming sheets are interposed between the ceramic green sheets, before firing. In a multilayer body 100 before firing shown in FIG. 2, three ceramic green sheets 110 (110c, 110d, and 110e) are stacked in the lower portion, two ceramic green sheets 110 (110a and 110b) are stacked in the upper portion, and two hollow-forming sheets 120 (120a and 120b) are stacked while being interposed between the ceramic green sheets 110b and 110c. In this regard, there is no particular limitation regarding the number of the ceramic green sheets and the number of the hollow-forming sheets.

The ceramic green sheets 110 are composed of the unfired ceramic material and have the interlayer connection metal conductor pastes 111. The hollow-forming sheets 120 are composed of carbon serving as the hollow-forming material and have the interlayer connection metal conductor pastes 121. In addition, leads (denoted by reference numerals 112 and 122) formed by using the metal conductor paste are disposed. The above-described lead is a concept including an electrode. A multilayer body before firing can be produced by subjecting a multilayer body in which the ceramic green sheets and the hollow-forming sheets are stacked, as described above, to thermocompression bonding.

In this regard, in the multilayer body preparation step, there is no particular limitation regarding the order of the processes as long as stacking is performed such that the multilayer body in which the hollow-forming sheet is interposed between the ceramic green sheets can be produced. A build-up system in which materials for forming the respective layers may be heaped up while being bored, and filled or printed with the metal conductor paste may be adopted rather than stacking respective layers that have been made into the shape of a sheet.

Subsequently, a firing step is performed. In the firing step, firing is performed at a firing temperature equal to or higher than the sintering starting temperatures of the metal conductor paste in the ceramic green sheet and the metal conductor paste in the hollow-forming sheet. As a result, the metal conductor paste in the ceramic green sheet and the metal conductor paste in the hollow-forming sheet are integrally sintered so as to form interlayer connection metal conductors. In addition, the unsintered ceramic material is sintered so as to form the ceramic layer. Further, the hollow-forming material is burnt off so as to form a hollow between the ceramic layers. FIG. 3 schematically shows a substrate after being fired through the firing step. In a substrate 50 after firing shown in FIG. 3, the unsintered ceramic material in the ceramic green sheets 110, the interlayer connection metal conductor pastes 111, and the leads 112 formed by using the metal conductor paste shown in FIG. 2 are sintered into the ceramic material, the metal conductors 11, and the metal leads 12, respectively, so as to produce the ceramic layers 10. Meanwhile, regarding the portion that corresponds to the hollow-forming sheets 120 in FIG. 2, the interlayer connection metal conductor paste 121 and the lead 122 formed by using the metal conductor paste are sintered and form the interlayer connection metal conductor 21 and the metal lead 22, respectively. In this regard, the carbon serving as the hollow-forming material is burnt off and a hollow 30 is formed at the location at which the carbon has been present. The thickness of the hollow 30 is determined in accordance with the total thickness of the hollow-forming sheets. In addition, the sintered metal conductor 21 and the metal lead 22 firmly bond to each other and, thereby, the predetermined thickness of the hollow 30 is maintained.

There is no particular limitation regarding the firing temperature during the firing step. In general, 800° C. or higher and 1,000° C. or lower is preferable.

There is no particular limitation regarding the firing atmosphere. Examples of the firing atmosphere include an air atmosphere and a low-oxygen atmosphere. In the present specification, the low-oxygen atmosphere refers to an atmosphere in which the oxygen partial pressure is lower than that in the air. Examples of the low-oxygen atmosphere include an inert gas atmosphere, e.g., a nitrogen atmosphere or an argon atmosphere, an atmosphere in which an inert gas, e.g., nitrogen, is mixed into the air, and a vacuum atmosphere. In addition, a mixed gas atmosphere of nitrogen and hydrogen may be adopted.

In the firing step, a constraining-layer-composite multilayer body having a structure in which a first constraining layer and a second constraining layer, each containing an inorganic material that is substantially not sintered at a firing temperature, are in close contact with the respective principal surfaces of ceramic green sheets located as outermost portions of a multilayer body before firing may be prepared, and the above-described constraining-layer-composite multilayer body may be fired so as to produce a fired substrate interposed between the above-described first constraining layer and second constraining layer. According to the above-described method, the constraining layers constrain shrinkage of the ceramic green sheets during the firing, shrinkage occurs only in the thickness direction of the ceramic green sheets, and shrinkage in the principal-surface direction does not occur substantially. Consequently, dimension accuracy of the resulting composite substrate can be improved.

Subsequently, a resin-layer-forming step of forming a resin layer in a hollow is performed. Regarding the method for forming the resin layer, a method in which a liquid containing a resin material is prepared, a substrate having the hollow is dipped into the liquid so as to fill the hollow with the resin material, and the resin material is cured is adopted. Regarding the liquid containing a resin material, the resin material itself may be liquid, or the liquid may be a resin solution, emulsion, or latex that is produced by mixing the resin material with a solvent. Alternatively, the liquid may be produced by heating a resin material to the softening temperature or higher so as to have fluidity. Further, a plasticizer, a dispersing agent, a curing agent, and the like may be added to the liquid containing a resin material, as the situation demands. Regarding curing of the resin material, when the resin material is a curable resin, e.g., a thermosetting resin or a photo-curable resin, curing may be performed in accordance with the curing condition of each resin. Meanwhile, in the case of a thermoplastic resin, the resin material may be solidified by heating the resin material so as to form a liquid having fluidity, filling the hollow with the liquid, and decreasing the temperature. Solidification of a resin material in the above-described procedure is also included in "curing of resin material" described in the present specification. The composite substrate according to the present invention shown in FIG. 1 can be produced by the above-described steps.

In addition, the resin layer may be formed by injecting a resin material or a liquid containing a resin material into the hollow between the ceramic layers through the surface serving as the side surface of the composite substrate.

Meanwhile, a resin layer containing a gap-forming material may be formed by including the gap-forming material into the resin material. The above-described hollow beads may be used as the gap-forming material.

Further, as the situation demands, an electrode formed on the surface of the composite substrate may be subjected to formation of a Ni plating film and formation of an Au plating film. In addition, an electronic component and the like may be mounted on the electrode.

Second Embodiment

In a composite substrate according to the present embodiment, ceramic layers include a first ceramic layer and a second ceramic layer, and a resin layer is present between the first ceramic layer and the second ceramic layer. In this regard, the composition of the ceramic material forming the first ceramic layer is different from the composition of the ceramic material forming the second ceramic layer. Other configurations may be set to be the same as the configurations in the composite substrate according to the first embodiment.

Figure 4:
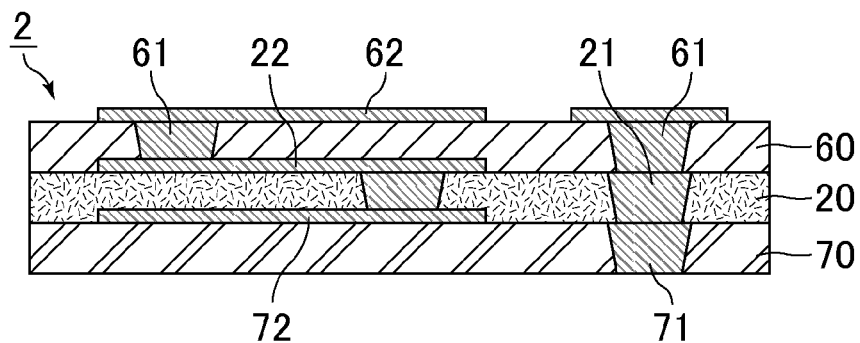
FIG. 4 is a schematic sectional view showing another example of the composite substrate according to an exemplary embodiment.

FIG. 4 is a schematic sectional view showing another example of the composite substrate according to the present invention. A composite substrate 2 includes a first ceramic layer 60 and a second ceramic layer 70 that serve as the ceramic layers, and a resin layer 20 is present between the first ceramic layer 60 and the second ceramic layer 70. The first ceramic layer 60, the resin layer 20, and the second ceramic layer 70 include an interlayer connection metal conductor 61, an interlayer connection metal conductor 21, and an interlayer connection metal conductor 71, respectively. In this regard, the interlayer connection metal conductor 61, the interlayer connection metal conductor 21, and the interlayer connection metal conductor 71 are integrated. In addition, the first ceramic layer 60, the resin layer 20, and the second ceramic layer 70 are provided with a metal lead 62, a metal lead 22, and a metal lead 72, respectively.

In an exemplary aspect, the ceramic material forming the first ceramic layer (hereafter also referred to as a first ceramic material) cab be a low-temperature-sintering ceramic material such that co-firing with a conductor composed of a low-melting-point metal, e.g., silver or copper, may be performed. The same low-temperature-sintering ceramic material as that used for the composite substrate according to the first embodiment may be used. Preferably, the ceramic material forming the second ceramic layer (hereafter also referred to as a second ceramic material) is a material that has characteristics (permittivity, magnetic permeability, thermal conductivity, and the like) different from the characteristics of the first ceramic material and that cannot be co-sintered with the first ceramic material. The material that cannot be co-sintered with the first ceramic material refers to a material that causes peeling or cracking at the interface between the first ceramic material and the second ceramic material due to a difference between shrinkage behavior at high temperature when co-sintering is performed or a material that causes mutual diffusion of the components of the first ceramic material and the second ceramic material at the interface of the two materials so as to hinder obtainment of predetermined characteristics. Preferably, a material in which a $BaO$—$Nd_2O_3$—$TiO_2$-based ceramic material and a borosilicate-based glass are mixed is used as the second ceramic material.

The resin layer is present between the first ceramic layer and the second ceramic layer, and the first ceramic layer and the second ceramic layer are not in direct contact with each other. Consequently, even when the first ceramic material and the second ceramic material are materials that cannot be co-sintered with each other, the above-described problem does not occur.

Figure 5:
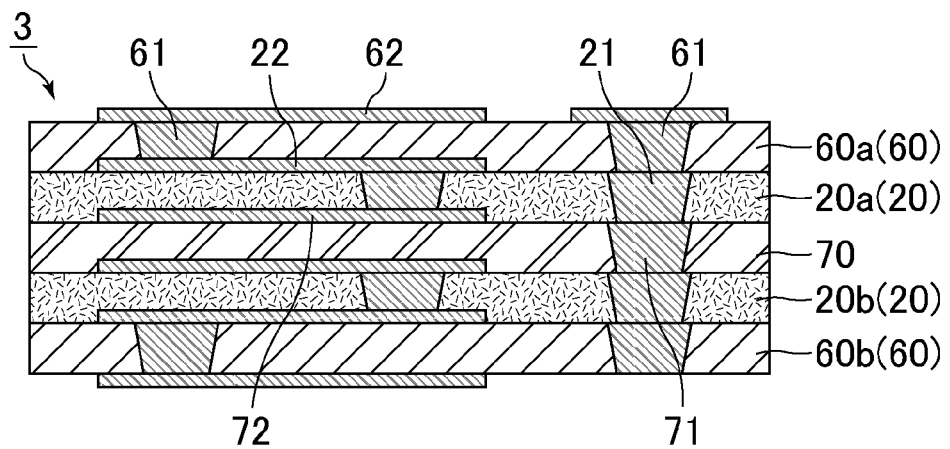
FIG. 5 is a schematic sectional view showing another example of the composite substrate according to an exemplary embodiment.

FIG. 5 is a schematic sectional view showing another example of the composite substrate according to the present invention. A composite substrate 3 has a configuration in which a first ceramic layer 60a, a resin layer 20a, a second ceramic layer 70, a resin layer 20b, and a first ceramic layer 60b are arranged sequentially from the top. The resin layer 20a is present between the first ceramic layer 60a and the second ceramic layer 70, and the resin layer 20b is present between the second ceramic layer 70 and the first ceramic layer 60b. The first ceramic material forming the first ceramic layer 60a and the first ceramic layer 60b and the second ceramic material forming the second ceramic layer 70 may be the same materials as those used for the composite substrate 2 described with reference to FIG. 4. In this case, also, the resin layer is present between the first ceramic layer and the second ceramic layer, and the first ceramic layer and the second ceramic layer are not in direct contact with each other. Consequently, even when the first ceramic material and the second ceramic material are materials that cannot be co-sintered with each other, the above-described problem does not occur.

Figure 6:
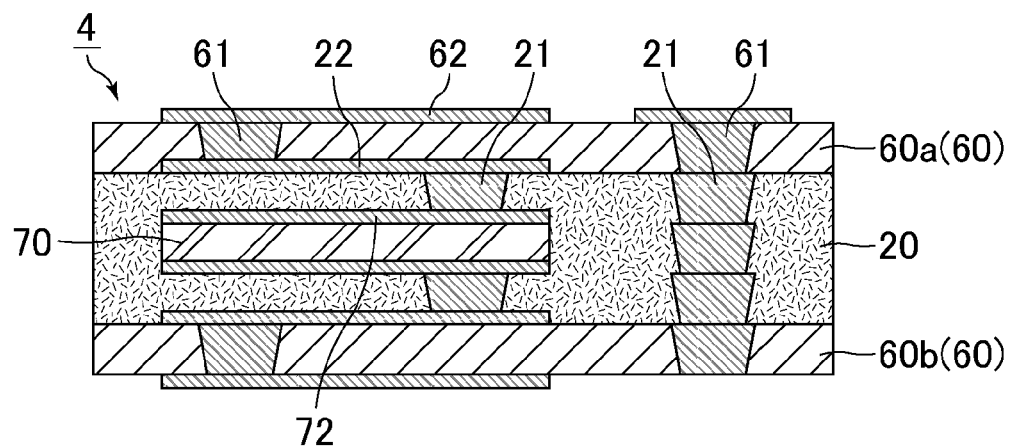
FIG. 6 is a schematic sectional view showing another example of the composite substrate according to an exemplary embodiment.

FIG. 6 is a schematic sectional view showing another example of the composite substrate according to the present invention. In a composite substrate 4, the second ceramic layer is not arranged as the entire layer but is arranged partly. Specifically, a second ceramic layer 70 is arranged as only part of the layer that corresponds to the second ceramic layer 70 in the composite substrate 3 shown in FIG. 5, and in the portion in which the second ceramic layer 70 is not arranged, a resin layer 20 is arranged so as to make up. Regarding the layer configuration, a first ceramic layer 60a, the resin layer 20, the second ceramic layer 70 in the resin layer 20, the resin layer 20, and the first ceramic layer 60b are arranged sequentially from the top. Also, in this case, the resin layer 20 is present between the first ceramic layer 60a and the second ceramic layer 70, and the resin layer 20 is present between the second ceramic layer 70 and the first ceramic layer 60b. The portion of the resin layer 20 that is arranged so as to make up for the portion in which the second ceramic layer 70 is not arranged is interposed between the first ceramic layer 60a and the first ceramic layer 60b. Consequently, it can be said that the entire resin layer 20 is interposed between the ceramic layers. The first ceramic material forming the first ceramic layer 60a and the first ceramic layer 60b and the second ceramic material forming the second ceramic layer 70 may be the same materials as those used for the composite substrate 2 described with reference to FIG. 4. Also, in this case, the resin layer is present between the first ceramic layer and the second ceramic layer, and the first ceramic layer and the second ceramic layer are not in direct contact with each other. Consequently, no problem occurs even when the first ceramic material and the second ceramic material are materials that cannot be co-sintered with each other.

The composite substrate according to the present embodiment may be produced basically in the same manner as the composite substrate according to the first embodiment. However, the manufacturing method is different from the method for manufacturing the composite substrate according to the first embodiment in the point that two types of ceramic green sheets are used. The method for manufacturing the composite substrate according to the present embodiment will be described below with reference to the steps for producing the composite substrate 3 shown in FIG. 5.

Initially, when the ceramic green sheets are prepared, two types of ceramic green sheets are prepared. One is a first ceramic green sheet containing the first ceramic material, and the other is a second ceramic green sheet containing the second ceramic material. Each of the first ceramic green sheet and the second ceramic green sheet is filled with the interlayer connection metal conductor paste. Meanwhile, a hollow-forming sheet that is composed of a hollow-forming material and that has the interlayer connection metal conductor paste is prepared.

Figure 7:
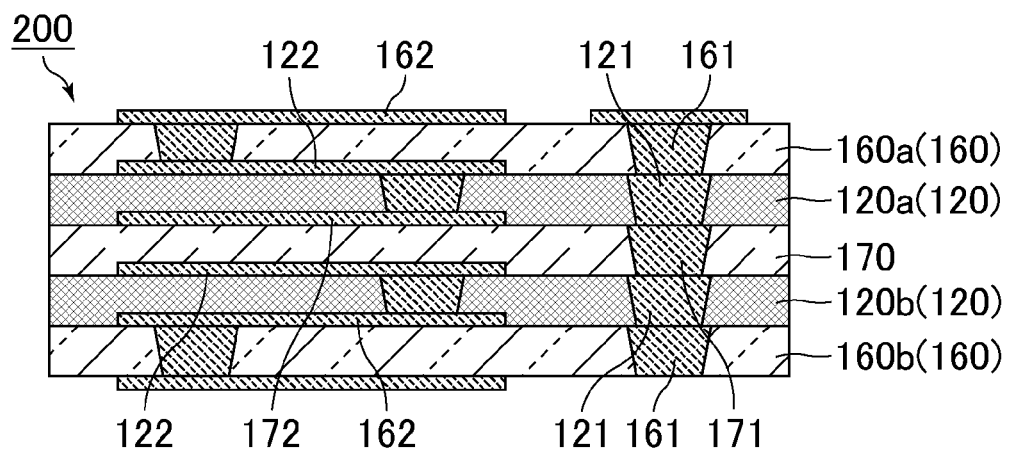
FIG. 7 is a schematic sectional view showing a multilayer body, in which first ceramic green sheets, hollow-forming sheets, and a second ceramic green sheet are stacked, before firing.

Subsequently, the first ceramic green sheets, the hollow-forming sheets, and the second ceramic green sheet are stacked. FIG. 7 is a schematic sectional view showing a multilayer body, in which first ceramic green sheets, hollow-forming sheets, and a second ceramic green sheet are stacked, before firing. In a multilayer body 200 before firing shown in FIG. 7, a first ceramic green sheet 160 (160b), a hollow-forming sheet 120 (120b), a second ceramic green sheet 170, a hollow-forming sheet 120 (120a), and a first ceramic green sheet 160 (160a) are stacked sequentially from the bottom. In addition, interlayer connection metal conductor pastes 121 in the hollow-forming sheets 120, interlayer connection metal conductor pastes 161 in the first ceramic green sheets 160, and an interlayer connection metal conductor paste 171 in the second ceramic green sheet 170 are stacked vertically.

Figure 8:
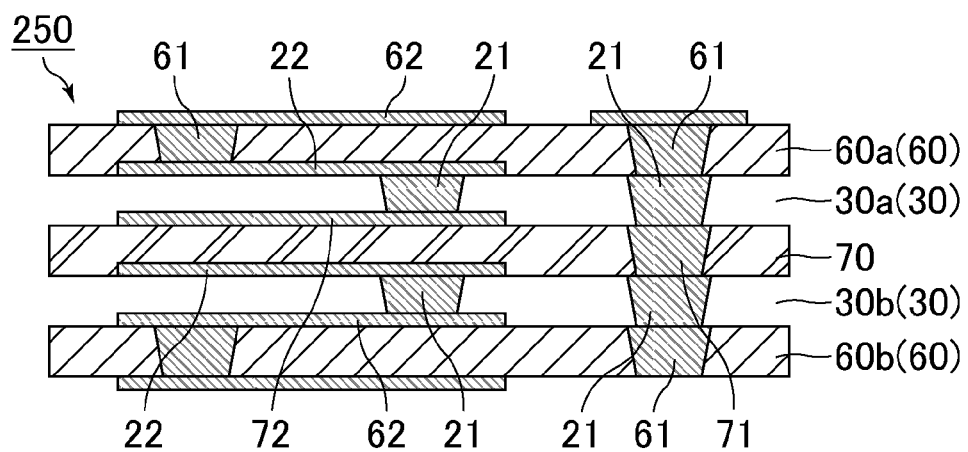
FIG. 8 is a schematic sectional view showing a substrate fired through a firing step.

Subsequently, a firing step is performed. In the firing step, the ceramic green sheets are sintered so as to produce ceramic layers and the hollow-forming material is burnt off so as to form a hollow between the ceramic layers in the same manner as the method for manufacturing the composite substrate according to the first embodiment. FIG. 8 is a schematic sectional view showing a substrate fired through a firing step. In a substrate 250 after firing shown in FIG. 8, unsintered first ceramic material in the first ceramic green sheets 160 (160a and 160b), the interlayer connection metal conductor pastes 161, and leads 162 formed by using a metal conductor paste in FIG. 7 are sintered into the first ceramic material, metal conductors 61, and metal leads 62, respectively, so as to form the first ceramic layers 60 (60a and 60b). Meanwhile unsintered second ceramic material in the second ceramic green sheet 170, the interlayer connection metal conductor paste 171, and lead 172 formed by using the metal conductor paste in FIG. 7 are sintered into the second ceramic material, a metal conductors 71, and a metal lead 72, respectively, so as to form the second ceramic layer 70. In addition, in the portions that are the hollow-forming sheets 120 (120a and 120b) in FIG. 7, the interlayer connection metal conductor pastes 121 and the leads 122 formed by using the metal conductor paste are sintered into interlayer connection metal conductors 21 and metal leads 22, respectively. In this regard, the carbon serving as the hollow-forming material is burnt off so as to form hollows 30 (30a and 30b) at locations at which the carbon has been present.

In the firing step, when a plurality of ceramic materials having different characteristics are co-sintered, there is a problem in that cracking or peeling occurs between the layers due to a small difference in the shrinkage or that material characteristics change due to mutual diffusion of the components of the ceramic materials between the layers. The above-described problem can be addressed by making the hollow-forming material present between the first ceramic green sheet and the second ceramic green sheet during sintering because the first ceramic layer and the second ceramic layer that are formed by sintering do not come into contact with each other.

Subsequently, the resin-layer-forming step of forming a resin layer in the hollow is performed in the same manner as the method for manufacturing the composite substrate according to the first embodiment so as to produce the composite substrate 3 shown in FIG. 5. The state in which a hollow is located between the first ceramic layer and the second ceramic layer causes a problem in terms of product reliability (impact resistance). Therefore, the product reliability can be ensured by filling the hollow with the resin material. As a result, a substrate in which a plurality of types of ceramic materials having different characteristics are disposed can be produced.

When the composite substrate 4 shown in FIG. 6 is produced, a multilayer body, in which a second ceramic green sheet is made small in size and a hollow-forming sheet is arranged in a portion where the second ceramic green sheet is not present in the layer at the same height as the height of the second ceramic green sheet, may be used.

Third Embodiment

Regarding the composite substrate according to the present embodiment, each of the ceramic layer and the resin layer in the composite substrate includes a functional portion (i.e., functional components), and the functional portion of the ceramic layer and the functional portion of the resin layer have the respective portions arranged at the same height. Other configurations may be set to be the same as the configurations in the composite substrate according to the first embodiment. In this regard, the first ceramic layer and the second ceramic layer may be included as in the composite substrate according to the second embodiment, but in the following description, the composition of the ceramic material is assumed to be one type.

Figure 9:
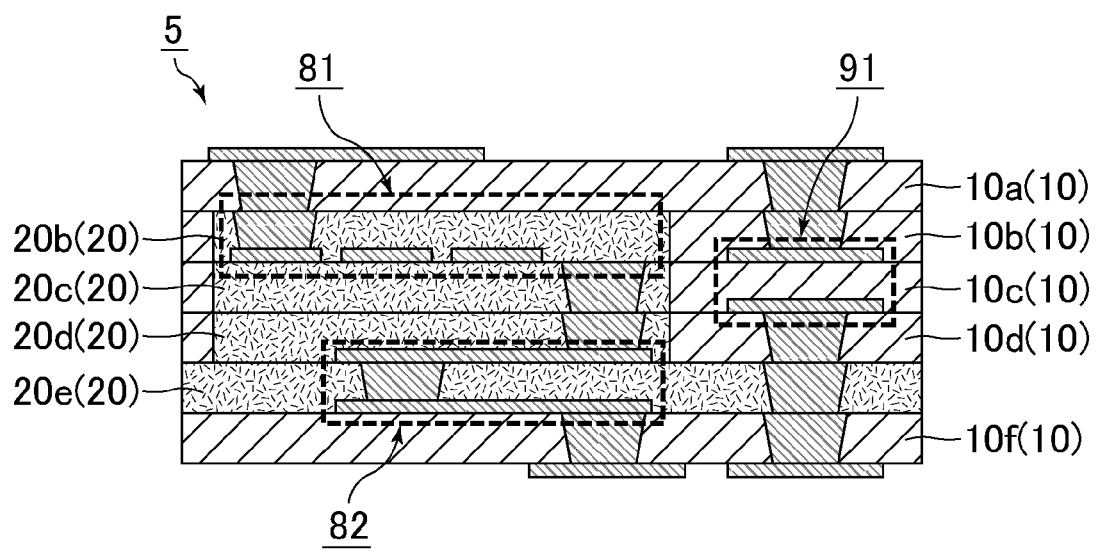
FIG. 9 is a schematic sectional view showing another example of the composite substrate according to an exemplary embodiment.

FIG. 9 is a schematic sectional view showing another example of the composite substrate according to the present invention. A composite substrate 5 includes ceramic layers 10 (10*a*, 10*b*, 10*c*, 10*d*, and 10*f*) and resin layers 20 (20*b*, 20*c*, 20*d*, and 20*e*). The resin layers 20 are interposed between the ceramic layer 10*a* and the ceramic layer 10*f*. Each pair of the ceramic layer 10*b* and the resin layer 20*b*, the ceramic layer 10*c* and the resin layer 20*c*, and the ceramic layer 10*d* and the resin layer 20*d* are the ceramic layer and the resin layer arranged at the same height.

In the resin layers 20, a spiral inductor 81 is disposed in a portion surrounded by a dotted line. In addition, a transmission line 82 is disposed in a portion surrounded by another dotted line. The spiral inductor 81 and the transmission line 82 are functional components included in the resin layers 20.

In the ceramic layers 10, a capacitor 91 is disposed in a portion surrounded by a dotted line. The capacitor 91 is a functional components included in the ceramic layers 10.

In the related art, when an inductor or a lead (transmission line) is included in the ceramic multilayer substrate, capacitive coupling with a GND electrode occurs because of high relative permittivity of the ceramic material, and high-frequency characteristics are poorer than those of a resin multilayer substrate. Meanwhile, when a capacitor is included in the resin multilayer substrate, for the purpose of ensuring the capacitance of the capacitor compared with the ceramic multilayer substrate, the number of layers has to be increased or the electrode area has to be increased because the relative permittivity of the resin material is low and, therefore, there are disadvantages in reduction in size and profile. In the composite substrate according to the present embodiment, the inductor and the transmission line are disposed in the resin layer having a low relative permittivity, and the capacitor is disposed in the ceramic layer having a high relative permittivity. As described above, the functional portions/components are disposed in accordance with the value of the relative permittivity. In addition, a reduction in profile is realized by making the functional portion/components of the ceramic layer and the functional portion/components of the resin layer include the respective portions that are arranged at the same height.

Figure 10:
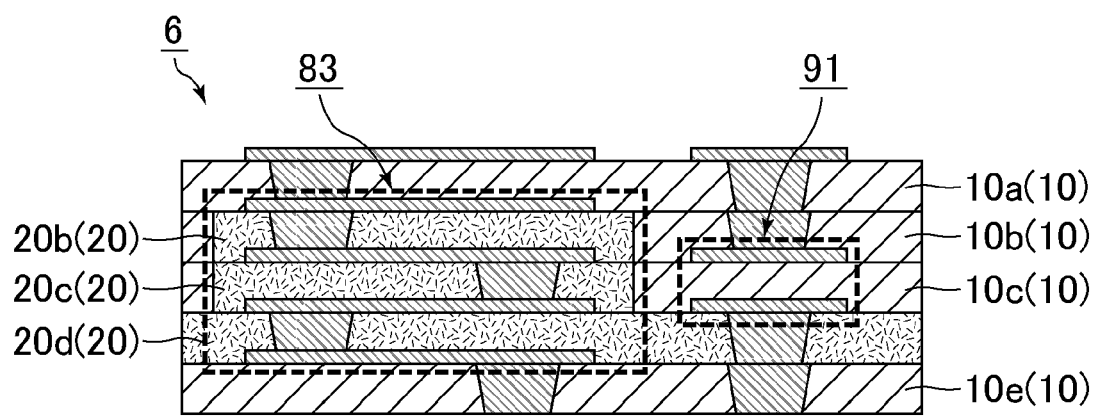
FIG. 10 is a schematic sectional view showing another example of the composite substrate according to an exemplary embodiment.

FIG. 10 is a schematic sectional view showing another example of the composite substrate according to the present invention. In a composite substrate 6 shown in FIG. 10, a helical inductor is disposed as the inductor. The composite substrate 6 includes ceramic layers 10 (10*a*, 10*b*, 10*c*, and 10*e*) and resin layers 20 (20*b*, 20*c*, and 20*d*). The resin layers 20 are interposed between the ceramic layer 10*a* and the ceramic layer 10*e*. Each pair of the ceramic layer 10*b* and the resin layer 20*b* and the ceramic layer 10*c* and the resin layer 20*c* are the ceramic layer and the resin layer arranged at the same height.

In the resin layers 20, a helical inductor 83 is disposed in a portion surrounded by a dotted line. The helical inductor 83 is a functional portion included in the resin layers 20.

In the ceramic layers 10, a capacitor 91 is disposed in a portion surrounded by a dotted line. The capacitor 91 is a functional portion included in the ceramic layers 10.

In the related art, when the helical inductor is disposed in the resin multilayer substrate, there is a problem in that a reduction in profile is difficult because the thickness per resin layer is large in the resin multilayer substrate. In the composite substrate according to the present embodiment, the thickness per resin layer can be made equal to the thickness per ceramic layer arranged at the same height. The thickness per resin layer can be made smaller than the thickness per resin layer in the resin multilayer substrate in the related art. Therefore, even when a helical inductor is disposed in the resin layer, the profile can be reduced by decreasing the thickness of the substrate.

The composite substrate according to the present embodiment may be produced basically in the same manner as the composite substrate according to the first embodiment. However, the manufacturing method is different from the method for manufacturing the composite substrate according to the first embodiment in the point that the ceramic green sheet is hollowed so as to make a portion for forming a resin layer, the hollow-forming sheet is cut so as to make a portion for forming a resin layer, and the two are combined so as to produce a composite sheet to be used.

The method for manufacturing the composite substrate according to the present embodiment will be described below with reference to the steps for producing the composite substrate 6 shown in FIG. 10. Initially, the ceramic green sheets are prepared and filled with the interlayer connection metal conductor pastes. Meanwhile, hollow-forming sheets that are composed of a hollow-forming material and that have the interlayer connection metal conductor paste are prepared.

The ceramic green sheet that is used at a location at which the ceramic layer and the resin layer are arranged at the same height is hollowed so as to make a portion for disposing a resin layer. Meanwhile, the hollow-forming sheet is cut so as to have the shape of a portion in accordance with the resin layer. The shape of the cut hollow-forming sheet is substantially the same as the shape of the portion made by hollowing the ceramic green sheet.

FIG. 11(*a*) is a schematic sectional view showing the manner of hollowing the ceramic green sheet, and FIG.

Figure 11A:
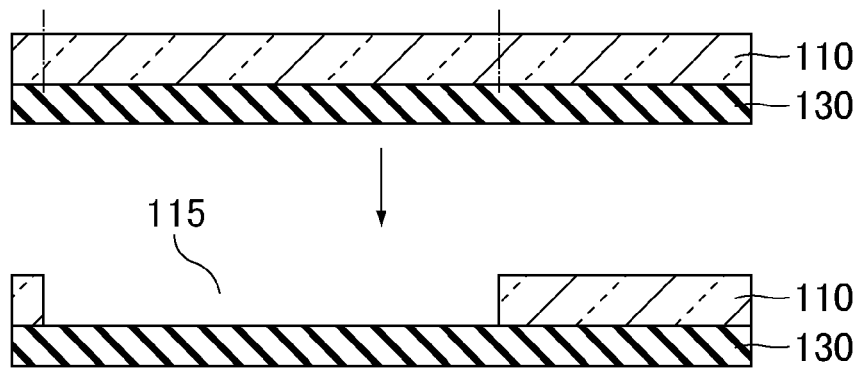
FIG. 11(a) is a schematic sectional view showing the manner of hollowing a ceramic green sheet.
Figure 11B:
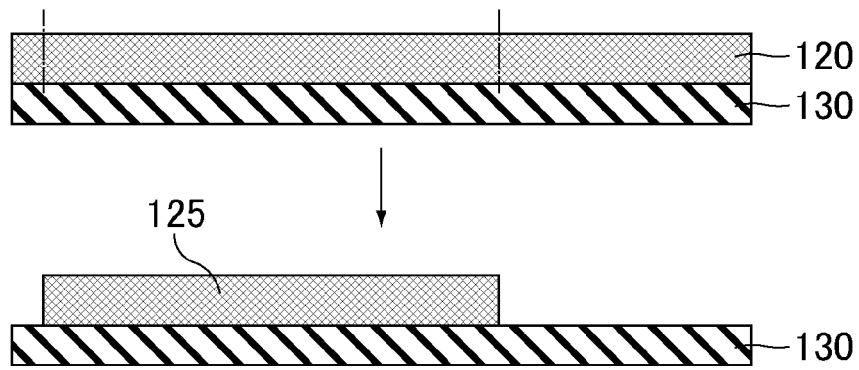
FIG. 11(b) is a schematic sectional view showing the manner of cutting a hollow-forming sheet.

11(b) is a schematic sectional view showing the manner of cutting the hollow-forming sheet. FIG. 11(a) shows the manner of forming a space 115 by hollowing a ceramic green sheet 110 disposed on a carrier film 130. The hollowing may be performed by using laser processing or the like. FIG. 11(b) shows the manner of forming a hollow-forming sheet 125 having substantially the same shape as the shape of the space 115 by cutting a hollow-forming sheet 120 disposed on a carrier film 130. In this regard, metal conductor pastes disposed in the ceramic green sheet and the hollow-forming sheet are not shown in FIG. 11(a) and FIG. 11(b).

Figure 12:
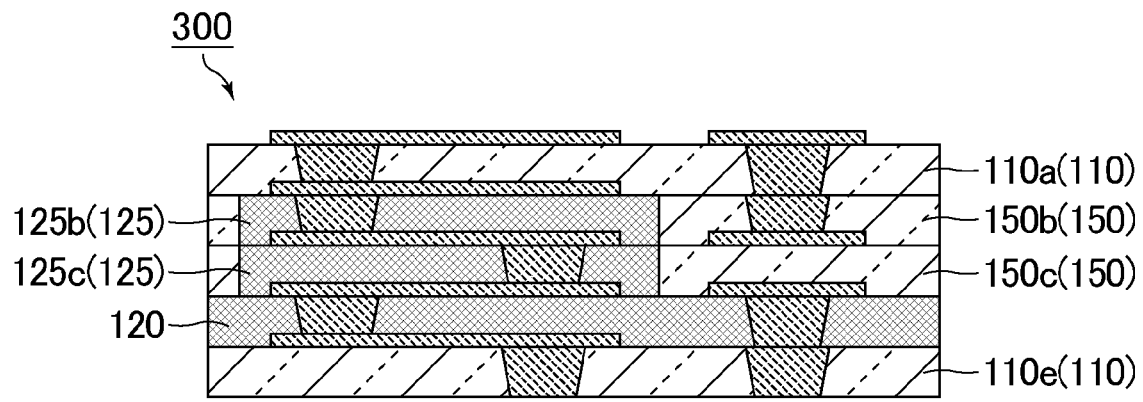
FIG. 12 is a schematic sectional view showing a multilayer body, in which ceramic green sheets, a hollow-forming sheet, and composite sheets are stacked, before firing.

Subsequently, the ceramic green sheets and the hollow-forming sheets are stacked. At this time, a composite sheet is produced by fitting the cut hollow-forming sheet to the space of the ceramic green sheet that is hollowed so as to make a portion for forming a resin layer, and the composite sheet, the ceramic green sheet, and the hollow-forming sheet are stacked. FIG. 12 is a schematic sectional view showing a multilayer body, in which the ceramic green sheets, the hollow-forming sheet, and the composite sheets are stacked, before firing. In a multilayer body 300 shown in FIG. 12 before firing, a ceramic green sheet 110 (110e), a hollow-forming sheet 120, a composite sheet 150 (150c), a composite sheet 150 (150b), and a ceramic green sheet 110 (110a) are stacked sequentially from the bottom. In this regard, metal conductor pastes for forming a capacitor is disposed in ceramic green sheet portions in the composite sheet 150c and the composite sheet 150b, and metal conductor pastes for forming a helical inductor is disposed in the hollow-forming sheets 125 (125c and 125b) in the composite sheet 150c and the composite sheet 150b.

Figure 13:
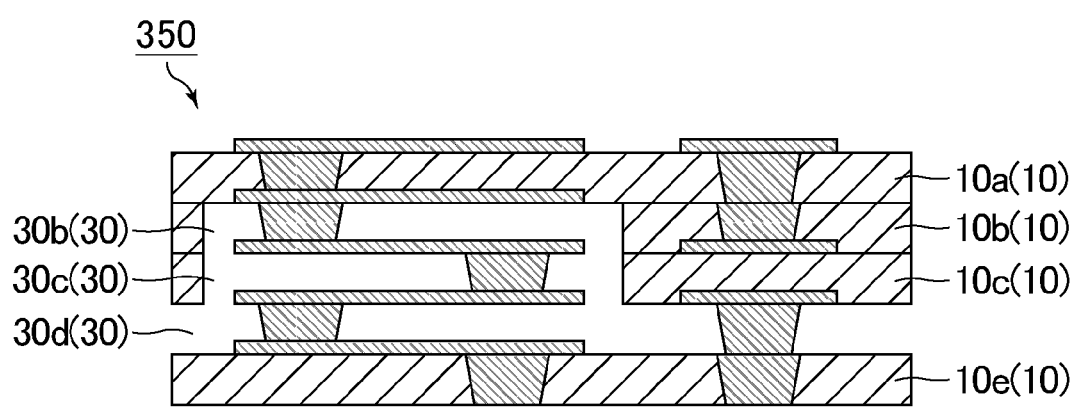
FIG. 13 is a schematic sectional view showing a substrate fired through a firing step.

Subsequently, a firing step is performed. In the firing step, the ceramic green sheets are sintered so as to produce ceramic layers and the hollow-forming material is burnt off so as to form a hollow between the ceramic layers in the same manner as the method for manufacturing the composite substrate according to the first embodiment. FIG. 13 is a schematic sectional view showing a substrate fired through a firing step. In a substrate 350 after firing shown in FIG. 13, carbon in the portion that is the hollow-forming sheet 120 and hollow-forming sheets 125 (125c and 125b) in the composite sheet 150c and the composite sheet 150b is burnt off so as to form hollows 30 (30b, 30c, and 30d) at locations at which the carbon has been present.

Subsequently, the resin-layer-forming step of forming a resin layer in the hollow is performed in the same manner as the method for manufacturing the composite substrate according to the first embodiment so as to produce the composite substrate 6 shown in FIG. 10. The resin layer may be formed by injecting a resin material into the hollow through the surface serving as the side surface of the composite substrate. The resin layer is formed in the hollow at the location at which the hollow-forming sheet has been present in the composite sheet and, thereby, a composite substrate including a portion in which the resin layer and the ceramic layer are arranged at the same height can be produced.

EXAMPLES

The composite substrate and the method for manufacturing a composite substrate according to the present invention will be specifically described below with reference to examples. In this regard, the present invention is not limited to these examples.

Example 1

Regarding a ceramic powder, powders containing $SiO_2$, $Al_2O_3$, and $BaCO_3$ were subjected to wet mixing and grinding and, thereafter, drying was performed so as to produce a mixture. The resulting mixture was heat-treated so as to produce a raw material powder for forming a ceramic green sheet. An organic binder, a dispersing agent, and a plasticizer were added, and mixing and grinding were performed so as to produce a slurry. The resulting slurry was formed into the shape of a sheet on a base material film by a doctor blade method and dried so as to produce a ceramic green sheet where thickness was adjusted such that the thickness after firing became a predetermined thickness. Via holes were formed in the ceramic green sheets by a laser, and the via holes were filled with a metal conductor paste. In addition, leads were formed of the metal conductor paste by screen printing. The metal conductor paste used contained copper serving as a metal material and the above-described ceramic powder. The proportion of copper in the metal conductor paste was set such that the proportion of copper contained in the metal conductor after firing became 40% by weight.

An organic binder, a dispersing agent, and a plasticizer were added to carbon, and mixing and grinding were performed so as to produce a slurry. The resulting slurry was formed into the shape of a sheet on a base material film by a doctor blade method and dried so as to produce a carbon sheet having a thickness of 30 μm, where thickness was adjusted such that the thickness after firing became a predetermined thickness. Via holes were formed in the carbon sheet by a laser, and the via holes were filled with a metal conductor paste. In addition, leads were formed of the metal conductor paste by screen printing. The metal conductor paste used was set to be the same as the metal conductor paste used for the ceramic green sheet.

As shown in FIG. 2, two ceramic green sheets, two carbon sheets, and three ceramic green sheets were stacked and thermocompression-bonded so as to produce a multilayer body before firing. The resulting multilayer body was sintered at 950° C. for 1 hour in a low-oxygen atmosphere so as to produce a substrate including a hollow (thickness of 60 μm) shown in FIG. 3. A liquid containing a fluororesin having a tensile modulus of elasticity of 0.4 GPa and serving as a resin material was infiltrated into the hollow, and a resin layer was formed by curing the fluororesin through heat treatment so as to produce a composite substrate.

Examples 2 to 5

Composite substrates were produced in the same manner as in example 1 except that the proportion of copper in the metal conductor paste was changed and the proportion of copper contained in the metal conductor after firing was changed.

Example 6

A composite substrate was produced in the same manner as in example 3 except that a resin layer in which a filler was mixed into a fluororesin and which had a tensile modulus of elasticity of 1 GPa was formed.

Example 7

A composite substrate was produced in the same manner as in example 3 except that a polyimide resin having a tensile modulus of elasticity of 3 GPa was used as the resin material.

Comparative Example 1

A substrate including a hollow was produced in the same manner as in example 1 up to the firing step and, thereafter, production of a substrate was finished without forming a resin layer so as to produce a substrate in which the hollow remained between ceramic layers.

Comparative Example 2

A resin substrate was produced by boring holes in a resin sheet composed of the same resin material as the resin material used in example 1 and successively performing pattern formation including formation of metal via holes through electroless plating and electroplating of copper. Ceramic green sheets were prepared separately in the same manner as in example 1 up to formation of leads, and only a predetermined number of ceramic green sheets were stacked and fired under the same condition as in example 1 so as to produce ceramic substrates. A composite substrate was produced by interposing the above-described resin substrate between the above-described ceramic substrates and performing thermocompression. In the resulting substrate, the proportion of copper contained in the metal conductor in the resin layer was 100%. In this regard, in the resulting substrate, the interlayer connection metal conductor in the ceramic layer and the interlayer connection metal conductor in the resin layer were not integrated.

(Evaluation of Electrical Characteristics)

The resistance value of the composite substrate produced in each of the examples and the comparative examples was measured. Each via hole having a diameter of 100 μm and a length of 150 μm was formed in the composite substrate, and the resistance value was measured by using a direct current four-terminal method. A case of 0.1Ω or less was indicated by ○, and a case of more than 0.1Ω was indicated by x. The evaluation results are shown in Table 1 collectively (shown below).

(Drop Impact Test)

The composite substrate produced in each of the examples and the comparative examples was subjected to a drop impact test. The drop impact test was performed by a method in conformity with JEDEC JESD22-B111. Regarding the test, 30 composite substrates were solder-mounted on a test substrate such that a daisy chain circuit was formed, and dropping with impact acceleration of 1,500 G, 1.0 ms, and a half-sign waveform was performed 100 times. A case where a fault, e.g., a breakage or a crack, was observed was indicated by x, a case where no fault, e.g., a breakage or a crack, was observed was indicated by ○, and a case where no fault, e.g., a breakage or a crack, was observed after dropping was performed 300 times at the same condition was indicated by ⊙. The evaluation results are shown in Table 1 collectively (shown below).

(Heat Cycle Test)

The composite substrate produced in each of the examples and the comparative examples was subjected to a heat cycle test. Regarding the test, 30 composite substrates were solder-mounted on a test substrate such that a daisy chain circuit was formed, and the cycle of +85° C. to −40° C. and a maintenance time of 30 min was performed 400 times. A case where a fault, e.g., a breakage or a crack, was observed was indicated by x, and a case where no fault, e.g., a breakage or a crack, was observed was indicated by ○. The evaluation results are shown in Table 1 collectively as follows.

TABLE 1

|  | Substrate configuration | Proportion of copper contained in metal conductor in resin layer (% by weight) | Tensile modulus of elasticity of resin layer (GPa) | Evaluation | | |
| --- | --- | --- | --- | --- | --- | --- |
|  |  |  |  | Resistance value | Drop impact test | Heat cycle test |
| Example 1 | ceramic + resin | 40 | 0.4 | ○ | ⊙ | ○ |
| Example 2 | ceramic + resin | 70 | 0.4 | ○ | ⊙ | ○ |
| Example 3 | ceramic + resin | 86 | 0.4 | ○ | ⊙ | ○ |
| Example 4 | ceramic + resin | 99 | 0.4 | ○ | ⊙ | ○ |
| Example 5 | ceramic + resin | 30 | 0.4 | X | ⊙ | ○ |
| Example 6 | ceramic + resin | 86 | 1 | ○ | ⊙ | ○ |
| Example 7 | ceramic + resin | 86 | 3 | ○ | ○ | ○ |
| Comparative example 1 | ceramic + hollow | — | — | ○ | X | X |
| Comparative example 2 | ceramic + resin | 100 | 0.4 | ○ | X | X |

In the composite substrate of each example, the resin layer interposed between the ceramic layers was disposed, and the interlayer connection metal conductor in the ceramic layer and the interlayer connection metal conductor in the resin layer were integrated. Therefore, resistance to drop impact was exhibited, and the bond between the metal conductors had strength sufficient for enduring the load of the heat cycle test. In particular, in each of examples 1 to 6 in which the tensile modulus of elasticity was low, higher resistance to drop impact was exhibited. The composite substrate of each of examples 1 to 4, 6, and 7 had good electrical characteristics because the proportion of copper contained in the interlayer connection metal conductor in the resin layer was 40% by weight or more. On the other hand, the substrate of comparative example 1 was not able to endure the drop impact and the load of the heat cycle test because a large hollow remained between the ceramic layers. The substrate of comparative example 2 was not able to endure the drop impact and the load of the heat cycle test because the interlayer connection metal conductor in the ceramic layer and the interlayer connection metal conductor in the resin layer were not integrated and, thereby, bonding strength between the interlayer connection metal conductors was low.

Example 8

Figure 14A:
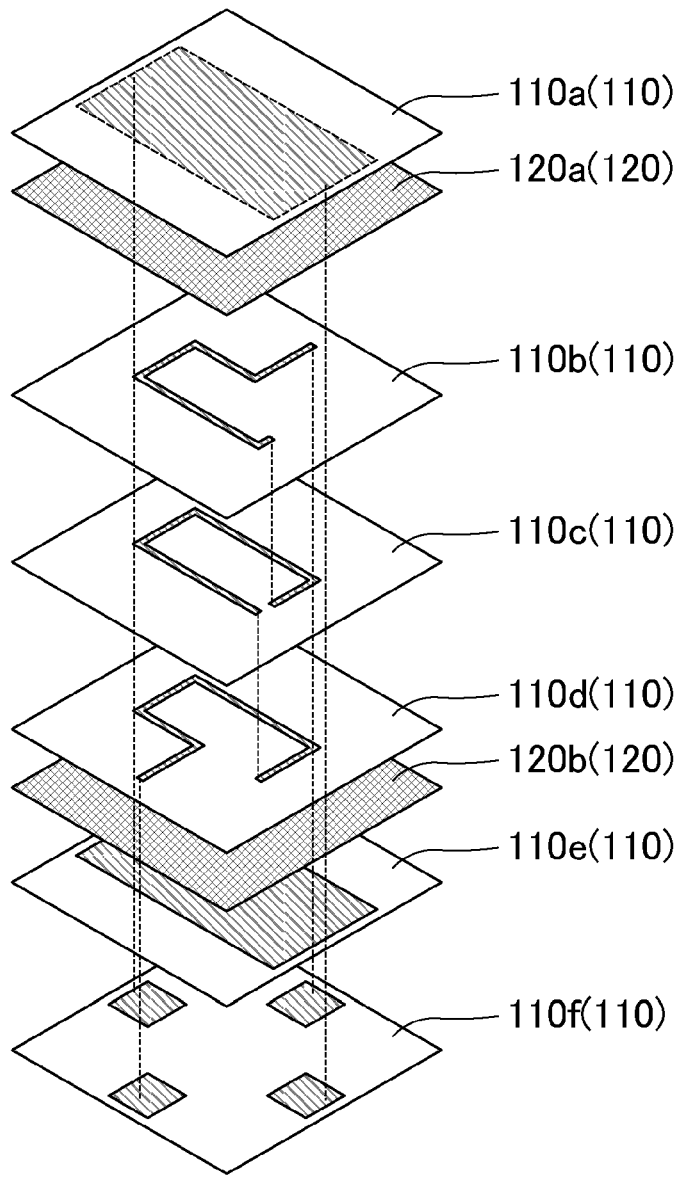
FIG. 14(a) is a layer diagram of the composite substrate produced in example 8.
Figure 14B:
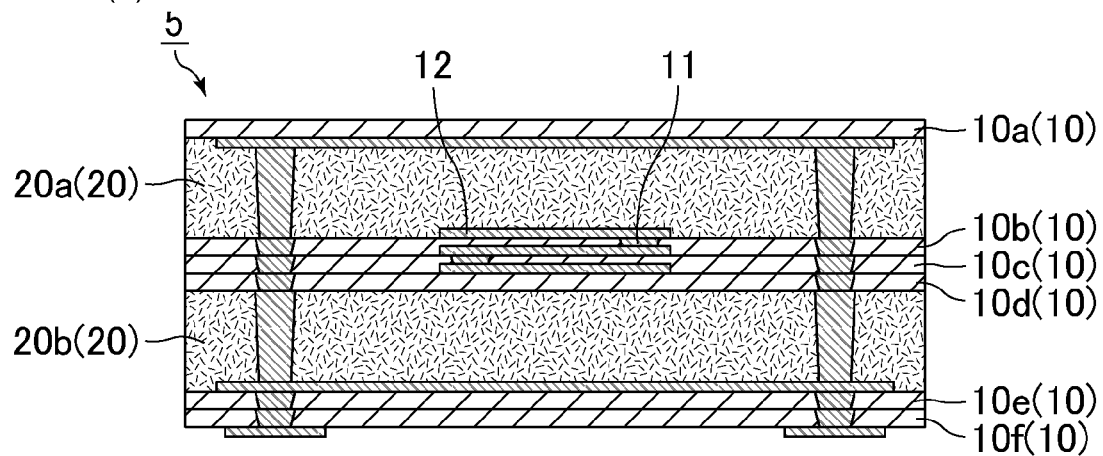
FIG. 14(b) is a schematic sectional view showing the composite substrate produced in example 8.

FIG. 14(a) is a layer diagram of the composite substrate produced in example 8, and FIG. 14(b) is a schematic sectional view showing the composite substrate produced in example 8. It is noted that ceramic green sheets and carbon sheets were produced in the same manner as in example 1. The thickness of the ceramic green sheet was set such that the total thickness of the ceramic layers became 40 μm after three ceramic green sheets were stacked and fired. Meanwhile, the thickness of the carbon sheet was set such that the thickness of the hollow formed after firing became 80 μm. Leads were formed on the ceramic green sheets and carbon sheets in accordance with the layer diagram shown in FIG. 14(a), and via holes were filled with the metal conductor paste. The ceramic green sheets (110a, 110b, 110c, 110d, 110d, 110e, and 110f) and the carbon layers (120a and 120b) were stacked and pressure-bonded in accordance with the layer diagram shown in FIG. 14(a) so as to produce a multilayer body before firing. Thereafter, the resulting multilayer body was fired in a low-oxygen atmosphere at 950° C. for 1 hour so as to produce a substrate including hollows (thickness of 80 μm).

A liquid including a fluororesin, in which 20% by volume of closed type hollow inorganic particles that contain $SiO_2$ as a primary component were dispersed as hollow beads, was prepared as a resin material, the hollows of the substrate were filled with the resin, and heat treatment was performed so as to cure the fluororesin. The resin layer including hollow beads was formed by this step, and a composite substrate was produced.

FIG. 14(b) is a schematic sectional view showing the composite substrate produced by the above-described steps. In a composite substrate 5 shown in FIG. 14(b), an inductor portion composed of a ceramic layer 10b, a ceramic layer 10c and a ceramic layer 10d was interposed between a resin layer 20a and a resin layer 20b. The composite substrate 5 served as an evaluation substrate for measuring the Q-value of the inductor.

Examples 9 to 13

Composite substrates were produced in the same manner as in example 8 except that the proportion of hollow beads included in the resin material was changed as shown in Table 2. In this regard, no hollow beads were included in example 12. The evaluation substrates produced in examples 8 to 13 and the resin layers formed of the resin materials used in examples 8 to 13 were evaluated as described below.

(Measurement of Q-Value of Inductor)

Regarding each of the above-described evaluation substrates, the Q-value of the inductor at 2 GHz was measured by using an impedance analyzer.

(Heat Cycle Test)

Each evaluation substrate was subjected to a heat cycle test in the same manner as in example 1. The number of cycles of the heat cycle test was set to be two types, 400 times that is the same as in example 1 and 1,000 times. Regarding the test of each number of cycles, a case where a fault, e.g., a breakage or a crack, was observed was indicated by x, and a case where no fault, e.g., a breakage or a crack, was observed was indicated by ○.

(Measurement of Relative Permittivity of Resin Layer)

Only the resin material used for forming the resin layer was cured so as to produce a resin layer for evaluating the characteristics. The relative permittivity of the resin layer was measured by using a perturbation method, where a sample having a size of 50 mm×50 mm×t of 0.5 mm was subjected to the measurement at a frequency of 9 GHz.

(Measurement of Thermal Expansion Coefficient of Resin Layer)

The thermal expansion coefficient of the above-described resin layer for evaluating the characteristics was measured in a temperature range of 25° C. to 300° C. at a rate of temperature increase of 5° C./min by using a thermal expansion coefficient measuring apparatus (TMA). The evaluation results of these tests are shown in Table 2 collectively as follows.

TABLE 2

| | Proportion of hollow beads in resin material (% by volume) | Relative permittivity of resin layer | Thermal expansion coefficient of resin layer (ppm/K) | Evaluation Heat cycle test 400 times | Heat cycle test 1,000 times | Q-value |
|---|---|---|---|---|---|---|
| Example 8 | 20 | 2.33 | 96 | ○ | ○ | 31 |
| Example 9 | 30 | 2.29 | 84 | ○ | ○ | 31 |
| Example 10 | 40 | 2.25 | 72 | ○ | ○ | 32 |
| Example 11 | 50 | 2.21 | 60 | ○ | ○ | 32 |
| Example 12 | 0 | 2.40 | 120 | ○ | X | 30 |
| Example 13 | 10 | 2.36 | 108 | ○ | X | 30 |

Regarding each of examples 8 to 11, the thermal expansion coefficient was decreased because the hollow beads were included in the resin layer, and the heat cycle resistance was improved because a difference in the thermal expansion between the ceramic layer and the resin layer was reduced. In addition, the relative permittivity of the resin layer was reduced and the Q-value was improved because the hollow beads were included.

REFERENCE SIGNS LIST 1, 2, 3, 4, 5, 6 composite substrate
10, 10a, 10b, 10c, 10d, 10e, 10f ceramic layer
11 interlayer connection metal conductor
12 metal lead
20, 20a, 20b, 20c, 20d, 20e resin layer
21 interlayer connection metal conductor
22 metal lead
30, 30a, 30b, 30c, 30d hollow
50, 250, 350 substrate after firing
60, 60a, 60b first ceramic layer
70 second ceramic layer
71 metal conductor
72 metal lead
81 spiral inductor
82 transmission line
83 helical inductor
91 capacitor
100, 200 multilayer body before firing
110, 110a, 110b, 110c, 110d, 110e, 110f ceramic green sheet 111 metal conductor paste
112 lead formed by using metal conductor paste
115 space
120, 120a, 120b, 125, 125b, 125c hollow-forming sheet (carbon sheet)
121 metal conductor paste
122 lead formed by using metal conductor paste
130 carrier film
150, 150b, 150c composite sheet
160, 160a, 160b first ceramic green sheet
161 metal conductor paste
170 second ceramic green sheet
171 metal conductor paste
172 lead formed by using metal conductor paste

The invention claimed is:

1. A composite substrate comprising:
an uninterrupted resin layer including at least two interlayer connection metal conductors stacked in a thickness direction of the composite substrate; and
a plurality of ceramic layers each including at least one interlayer connection metal conductor,
wherein the uninterrupted resin layer is interposed between a pair of the plurality ceramic layers,
wherein the at least two interlayer connection metal conductors stacked in the uninterrupted resin layer are integrated with the at least one interlayer connection metal conductor in each of the pair of ceramic layers, and
wherein the uninterrupted resin layer includes a lead that extends in the uninterrupted resin layer and directly connects a pair of the at least two interlayer connection metal conductors in the uninterrupted resin layer that are offset from each other in the thickness direction of the composite substrate and offset relative to a direction perpendicular to the thickness direction.

2. The composite substrate according to claim 1, wherein the at least two interlayer connection metal conductors in the uninterrupted resin layer comprise a metal material having a proportion that is 40% by weight or greater and 99% by weight or less.

3. The composite substrate according to claim 2, wherein a difference between the proportion (% by weight) of the metal material of the interlayer connection metal conductors in the uninterrupted resin layer and a proportion (% by weight) of a metal material of each interlayer connection metal conductor in the plurality of ceramic layers is 59% by weight or less.

4. The composite substrate according to claim 1, wherein the uninterrupted resin layer comprises a tensile modulus of elasticity that is 3 GPa or less.

5. The composite substrate according to claim 1, wherein the uninterrupted resin layer comprises a relative permittivity $\varepsilon_r$ that is 1.5 or more and 3 or less.

6. The composite substrate according to claim 1, wherein the uninterrupted resin layer comprises a thickness that is 5 µm or more and 100 µm or less.

7. The composite substrate according to claim 1, wherein the uninterrupted resin layer comprises at least one void extended therein and configured to reduce a permittivity of the uninterrupted resin layer.

8. The composite substrate according to claim 1, wherein the uninterrupted resin layer contains a gap-forming material configured to reduce a permittivity of the uninterrupted resin layer.

9. The composite substrate according to claim 1, wherein the pair of the plurality of ceramic layers include a first ceramic layer and a second ceramic layer,
wherein the uninterrupted resin layer is disposed between the first ceramic layer and the second ceramic layer, and
wherein a composition of a ceramic material of the first ceramic layer is different from a composition of a ceramic material of the second ceramic layer.

10. The composite substrate according to claim 1, wherein a portion of the uninterrupted resin layer is exposed at one or more side surfaces of the composite substrate.

11. The composite substrate according to claim 1,
wherein each of the plurality of ceramic layers and the uninterrupted resin layer includes a functional component, and
wherein the functional component of each of the plurality of ceramic layers and the uninterrupted resin layer have respective portions having a same height as one another.

12. The composite substrate according to claim 11, wherein the functional component of the ceramic layer is a capacitor, and the functional component of the uninterrupted resin layer is one of an inductor or a transmission line.

13. The composite substrate according to claim 11, wherein the functional component of the uninterrupted resin layer is a helical inductor.

14. The composite substrate according to claim 1, wherein the interlayer connection metal conductors disposed in the uninterrupted resin layer and the at least one interlayer connection metal conductor in each of the pair of ceramic layers are all disposed in a straight line in a thickness direction of the composite substrate.

15. The composite substrate according to claim 1,
wherein the uninterrupted resin layer and the pair of the plurality of ceramic layers each include at least first and second interlayer connection metal conductors,
wherein the respective first interlayer connection metal conductors of each of the uninterrupted resin layer and the pair of the plurality of ceramic layers are all disposed in a straight line in the thickness direction of the composite substrate, and
wherein the respective second interlayer connection metal conductors of the uninterrupted resin layer and at least one of the pair of the plurality of ceramic layers do not overlap each other in the thickness direction of the composite substrate.

16. A method for manufacturing a composite substrate, the method comprising:
preparing a multilayer body by stacking a plurality of ceramic green sheets that are composed of an unsintered ceramic material and that each have an interlayer connection metal conductor paste with a hollow-forming sheet that is composed of a hollow-forming material and that has an interlayer connection metal conductor paste, such that a metal lead extends in the hollow-forming sheet and directly connects at least two interlayer connection metal conductors in the hollow-forming sheet that are offset from each other in a thickness direction of the multilayer body and offset relative to a direction perpendicular to the thickness direction, with the hollow-forming sheet being interposed between a pair of the plurality of ceramic green sheets to form the multilayer body;
firing the multilayer body at a firing temperature equal to or higher than sintering starting temperatures of the metal conductor paste in the ceramic green sheets and the metal conductor paste in the hollow-forming sheet to form an integrated interlayer connection metal conductor by integrally co-sintering the metal conductor paste in the ceramic green sheets and the metal conductor paste in the hollow-forming sheet, such that a plurality of ceramic layers are formed by sintering the unsintered ceramic material and a hollow is formed between the plurality of ceramic layers by burning off the hollow-forming material; and forming a resin layer between a pair of the plurality of ceramic layers by dipping a substrate having the hollow into a liquid containing a resin material so as to fill the hollow with the resin material and curing the resin material.

17. The method for manufacturing a composite substrate according to claim 16, wherein the hollow-forming sheet is a carbon sheet and the hollow-forming material is carbon.

18. The method for manufacturing a composite substrate according to claim 16, wherein the hollow-forming material is a material having a weight decreasing rate of 10% or less when firing for 1 hour at the sintering starting temperature of the metal conductor paste in the hollow-forming sheet and having a weight decreasing rate of 99% or more when firing for 1 hour at a firing temperature during the step of firing the multilayer body.

19. The method for manufacturing a composite substrate according to claim 18, wherein the firing temperature during the step of firing the multilayer body is between 800° C. and 1,000° C.

\* \* \* \* \*